United States Patent
Chang et al.

(10) Patent No.: US 7,763,891 B2
(45) Date of Patent: Jul. 27, 2010

(54) PIXEL STRUCTURE AND ACTIVE DEVICE ARRAY SUBSTRATE

(75) Inventors: Yuan-Hao Chang, Taipei (TW); Chia-Ming Chiang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 12/207,509

(22) Filed: Sep. 10, 2008

(65) Prior Publication Data

US 2009/0173946 A1    Jul. 9, 2009

(30) Foreign Application Priority Data

Jan. 9, 2008    (TW) ............... 97100875 A

(51) Int. Cl.
*H01L 27/14* (2006.01)
(52) U.S. Cl. ............... 257/72; 257/59; 257/66; 257/83; 257/222; 257/262
(58) Field of Classification Search ............ 257/83
See application file for complete search history.

(56) References Cited

U.S. PATENT DOCUMENTS 6,897,908 B2   5/2005   Lee et al.

2002/0113914 A1   8/2002   Shiga et al.
2008/0044982 A1*  2/2008   You .................... 438/443

FOREIGN PATENT DOCUMENTS

| CN | 1499275 | 5/2004 |
|---|---|---|
| CN | 1707343 | 12/2005 |
| CN | 1985209 | 6/2007 |
| TW | 594347 | 6/2004 |

OTHER PUBLICATIONS

"1st Office Action of China counterpart application", issued on Nov. 13, 2009, p. 1-p. 5.

* cited by examiner

*Primary Examiner*—N Drew Richards
*Assistant Examiner*—Kyoung Lee
(74) *Attorney, Agent, or Firm*—Jianq Chyun IP Office

(57) ABSTRACT

A pixel structure including an active device, a common line pattern, a protective layer, a pixel electrode, and a patterned semiconductor layer is provided. The active device is disposed on a substrate. In addition, the common line pattern is disposed on the substrate and covered with an insulation layer. The protective layer covers the active device and a part of the insulation layer. The protective layer has a contact window exposing the active device. The pixel electrode is disposed on the protective layer and electrically connected to the active device through the contact window. The patterned semiconductor layer is disposed on the insulation layer above the common line pattern. The patterned semiconductor layer is located between the common line pattern and the pixel electrode.

12 Claims, 4 Drawing Sheets

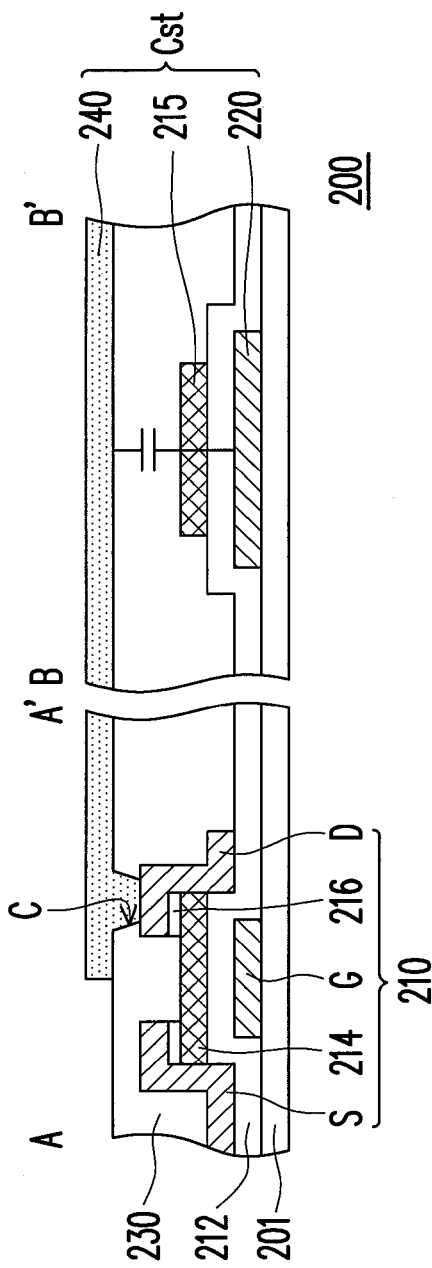
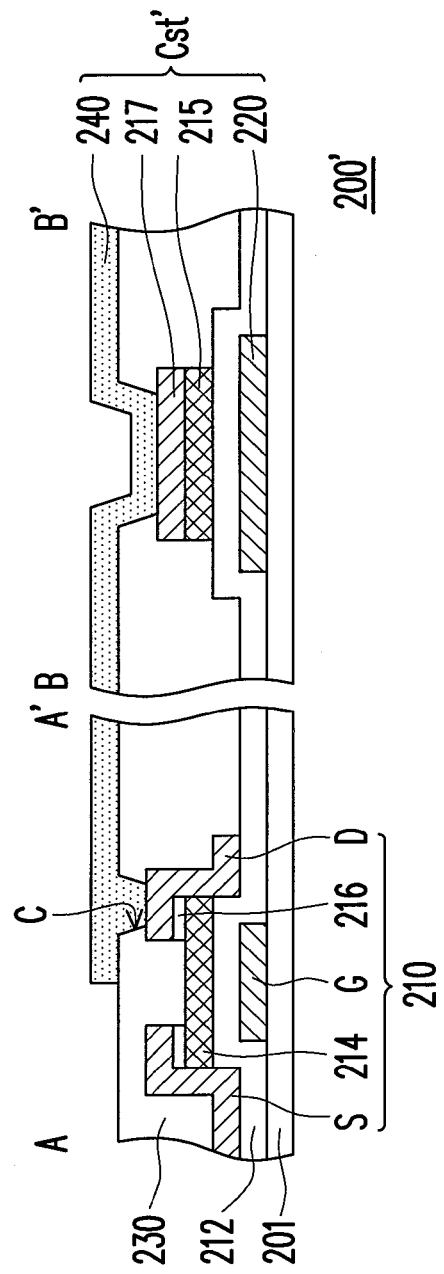
FIG. 2B
FIG. 2C

US 7,763,891 B2

PIXEL STRUCTURE AND ACTIVE DEVICE ARRAY SUBSTRATE

CROSS-REFERENCE TO RELATED APPLICATION

This application claims the priority benefit of Taiwan application serial no. 97100875, filed on Jan. 9, 2008. The entirety of the above-mentioned patent application is hereby incorporated by reference herein and made a part of specification.

BACKGROUND OF THE INVENTION

1. Field of the Invention

The present invention relates to a pixel structure and an active device array substrate, and more particularly to a pixel structure and an active device array substrate capable of improving display quality.

2. Description of Related Art

Recently, the advancement of semiconductor devices and display devices flourishingly spreads the development of the multi-media technology. In respect of displays, thin-film transistor liquid-crystal displays (TFT-LCD) having superior features, such as high definition, compressed space occupation, low power consumption, and free of radiation gradually becomes the mainstream product in the market. A TFT-LCD is mainly constituted of a TFT array substrate, a color filter substrate, and a liquid crystal layer between two substrates.

FIG. 1A is a schematic view of a circuit of a conventional TFT array substrate. Referring to FIG. 1A, the conventional TFT-array substrate 100 includes a plurality of scan lines S1-Sn, a plurality of data lines D1-Dn, and a plurality of pixel structures P1-Pi. Specifically, the pixel structures P1-Pi are electrically connected to the corresponding scan lines S1-Sn and data lines D1-Dn. As shown in FIG. 1A, the pixel structure P1 is electrically connected to the scan line S1 and the data line D1. Actually, a switch signal transmitted by the scan line S1 may turn on the TFT T1. After the TFT T1 has been turned on, a display signal may be transmitted to the pixel structure P1 through the data line D1. It should be noted that the switch signal received by a farther TFT T1 may be decayed due to the influences of a resistance-capacitance delay (RC delay), a capacitance coupling effect, or a load.

FIG. 1B is a schematic view of a pixel voltage decay of the pixel structure P1 in FIG. 1A, and FIG. 1C is a schematic view of a pixel voltage decay of a farther pixel structure Pi in FIG. 1A. Referring to FIGS. 1B and 1C, when the pixel structure P1 receives the switch signal G1, the switch signal G1 may keep the TFT T1 turning on for a period of time, so as to allow the display signal da1 to be transmitted to the pixel structure P1. When the TFT T1 is turned off, the display signal da1 can not be continuously transmitted to the pixel structure P1, and thus the pixel voltage dr1 has a voltage drop. The voltage drop is called a feedthrough voltage $\Delta Vp1$.

It should be noted that the switch signal G1' received by the remote TFT Ti is decayed due to the influences of the circuit delay, the capacitance coupling effect, or the load. Especially, in a large-sized liquid crystal display panel, the feedthrough voltage $\Delta Vp2$ of the remote pixel structure Pi is smaller than the feedthrough voltage $\Delta Vp1$ of the pixel structure P1. In this manner, the difference between the feedthrough voltages $\Delta Vp1$ and $\Delta Vp2$ may possibly cause an effect of flicker in display frame, which degrades display quality. Therefore, it is necessary to make improvement.

SUMMARY OF THE INVENTION

The present invention is directed to provide a pixel structure capable of efficiently preventing a display frame flicker phenomenon.

The present invention is also directed to provide an active device array substrate, which enables the pixels to have a similar feedthrough voltage, so as to improve the display quality.

The present invention provides a pixel structure, which is disposed on a substrate and adapted to be electrically connected to a scan line and a data line. The pixel structure of the present invention includes an active device, a common line pattern, a protective layer, a pixel electrode, and a patterned semiconductor layer. The active device is disposed on the substrate and has an insulation layer extending to the substrate. Furthermore, the common line pattern is disposed on the substrate, and covered with the insulation layer. In addition, the protective layer covers the active device and a part of the insulation layer, and has a contact window exposing the active device. The pixel electrode is disposed on the protective layer, and electrically connected to the active device through the contact window. The patterned semiconductor layer of the present invention is disposed on the insulation layer above the common line pattern, and disposed between the common line pattern and the pixel electrode, so as to form a storage capacitor.

In an embodiment of the present invention, the storage capacitor has a capacitance changing along with a size of area of the patterned semiconductor layer.

In an embodiment of the present invention, the common line pattern has an H shape.

In an embodiment of the present invention, the storage capacitor further includes a metal layer disposed on the patterned semiconductor layer and electrically connected to the pixel electrode, and the metal layer and the data line are in a same film layer.

In an embodiment of the present invention, the active device includes a gate, a channel layer, a source, a drain, and an ohmic contact layer. The gate is disposed on the substrate and electrically connected to the scan line, and the insulation layer covers the gate. Furthermore, the channel layer is disposed on the insulation layer above the gate. The ohmic contact layer is disposed between the source and the channel layer and between the source and the channel layer. The source is electrically connected to the data line, and the drain is electrically connected to the pixel electrode.

The present invention provides an active device array substrate, which includes a substrate and a plurality of pixel structures. The pixel structures are disposed on the substrate, and each pixel structure is electrically connected to a corresponding scan line and data line. The pixel structure of the present invention includes an active device, a common line pattern, a protective layer, a pixel electrode, and a patterned semiconductor layer. The active device is disposed on the substrate and has an insulation layer extending to the substrate. Furthermore, the common line pattern is disposed on the substrate and covered with the insulation layer. In addition, the protective layer covers the active device and a part of the insulation layer. The protective layer has a contact window exposing the active device. The pixel electrode is disposed on the protective layer, and electrically connected to the active device through the contact window. The patterned semiconductor layer of the present invention is disposed on the insulation layer above the common line pattern, and disposed between the common line pattern and the pixel electrode, so as to form a storage capacitor.

In an embodiment of the present invention, the storage capacitor has a capacitance changing along with a size of area of the patterned semiconductor layer. In an embodiment of the present invention, each of the data lines transmits a display signal to the pixel structure, and the area of the patterned semiconductor layer in the pixel structure is gradually increased in the transmission direction of the display signal.

In an embodiment of the present invention, the scan line may transmit a switch signal to the pixel structure, and the area of the patterned semiconductor layer in the pixel structure is gradually increased in the transmission direction of the switch signal.

In an embodiment of the present invention, the common line pattern is in an H shape.

In an embodiment of the present invention, the storage capacitor further includes a metal layer disposed on the patterned semiconductor layer and electrically connected to the pixel electrode, and the metal layer and the data line are in a same film layer.

In an embodiment of the present invention, the active device includes a gate, a channel layer, a source, a drain, and an ohmic contact layer. The gate is disposed on the substrate and electrically connected to the scan line, and the insulation layer covers the gate. Furthermore, the channel layer is disposed on the insulation layer above the gate. The ohmic contact layer is disposed between the source and the channel layer and between the source and the channel layer. The source is electrically connected to the data line, and the drain is electrically connected to the pixel electrode.

The capacitance of the storage capacitor of the present invention may be adjusted by changing a size of the area of the patterned semiconductor layer. Therefore, the pixel structures at the different positions of the active device array substrate of the present invention may have a consistent feedthrough voltage. As such, the active device array substrate of the present invention may efficiently prevent a display frame flicker phenomenon, thereby improving the display quality.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2B is a schematic sectional view of a pixel structure taken along sectional lines A-A' and B-B' according to the present invention.

FIG. 2C is a schematic view of another storage capacitor according to the present invention.

DESCRIPTION OF THE EMBODIMENTS

Figure 1A:
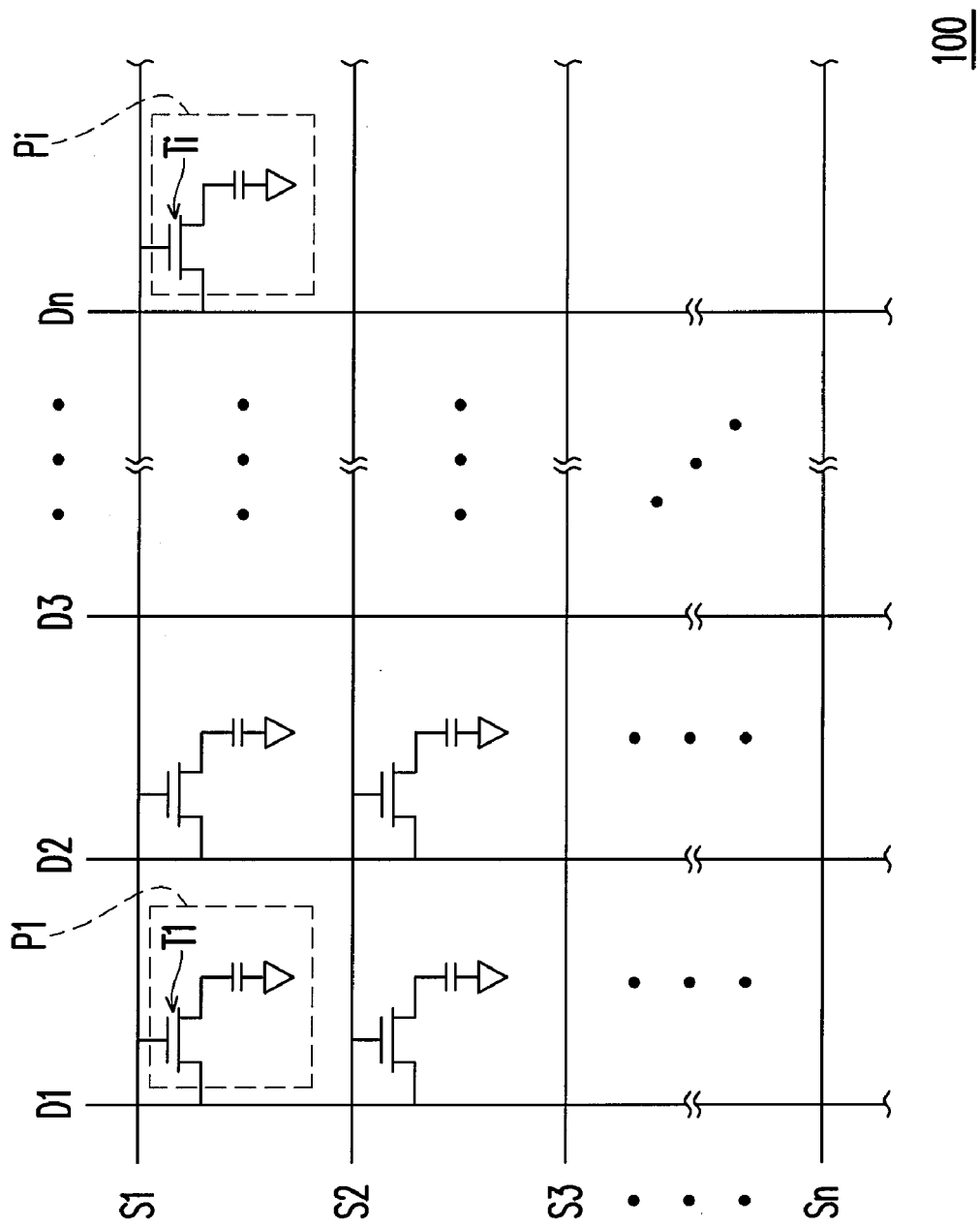
FIG. 1A is a schematic view of a circuit of a conventional TFT array substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
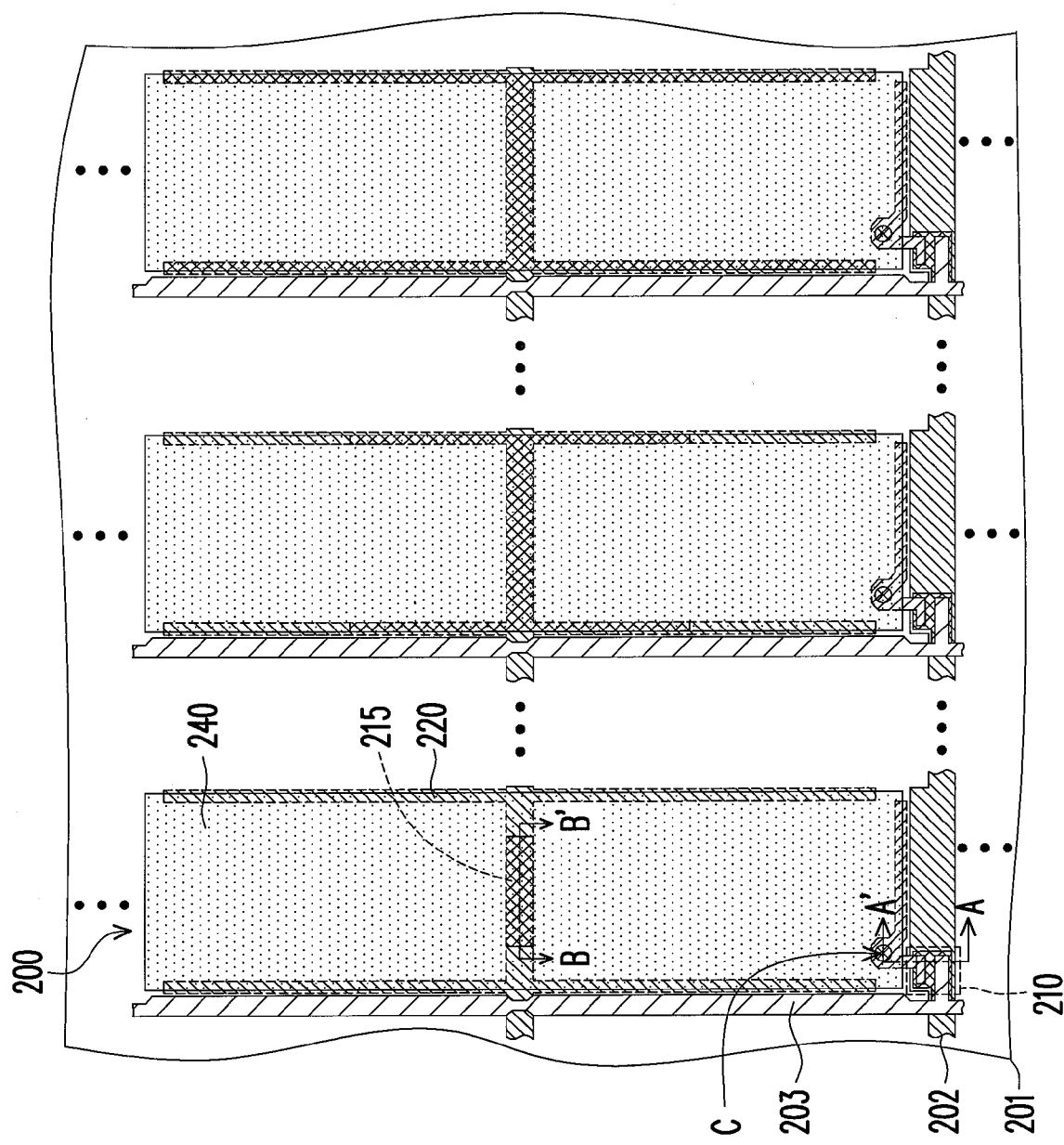
FIG. 2A is a schematic view of an active device array substrate according to the present invention.

FIG. 2A is a schematic view of an active device array substrate according to an embodiment of the present invention, and FIG. 2B is a schematic sectional view of a pixel structure taken along sectional lines A-A' and B-B' according to an embodiment of the present invention. Referring to FIGS. 2A and 2B, the active device array substrate 300 of the present invention includes a substrate 201 and a plurality of pixel structures 200. The pixel structures 200 are disposed on the substrate 201 and arranged in array, and each pixel structure 200 is electrically connected to a corresponding scan line 202 and a corresponding data line 203. In detail, the scan line 202 may transmit a switch signal to sequentially turn on the active devices 210 in the same row. After the active devices 210 is turned on, the display signal may be transmitted to the pixel electrodes 240 through the data lines 203.

In detail, the pixel structure 200 of the present invention includes an active device 210, a patterned semiconductor layer 215, a common line pattern 220, a protective layer 230, and a pixel electrode 240. The aforementioned active device 210 may include a gate G, a source S, a drain D, a channel layer 214, and an ohmic contact layer 216. The gate G is disposed on the substrate 201 and electrically connected to the scan line 202 as shown in FIG. 2A, and the insulation layer 212 covers the gate G. It should be noted here that the gate G may be a part of the scan line 202. Furthermore, the channel layer 214 is disposed on the insulation layer 212 above the gate G. The material of the channel layer 214 may include a semiconductor material.

In order to reduce the contact resistance between the semiconductor material and the metal material, the ohmic contact layer 216 may be disposed between the source S and the channel layer 214 and between the drain D and the channel layer 214. On the other hand, the source S is electrically connected to the data line 203 in FIG. 2A, and the drain D is electrically connected to the pixel electrode 240 through a contact window C of the protective layer 230. It should be noted here that the active device 210 of the present invention is a structure of a bottom gate. Definitely, the active device 210 may also be, but not limited to, a structure of a top gate.

Furthermore, the common line pattern 220 is disposed on the substrate 201, and the insulation layer 212 extending out of the active device 210 may cover the common line pattern 220. As shown in FIG. 2A, the layout of the common line pattern 220 of the present invention has an H shape. Definitely, those of ordinary skill in the art should know that the layout of the common line pattern 220 of the present invention may be in another shape as required, which is described for illustration but not intended to limit the scope of the present invention. Especially, the patterned semiconductor layer 215 of the present invention is disposed on the insulation layer 212 above the common line pattern 220, and the patterned semiconductor layer 215 is located between the common line pattern 220 and the pixel electrode 240. In other words, the patterned semiconductor layer 215, the common line pattern 220, and the pixel electrode 240 may form a storage capacitor Cst. The patterned semiconductor layer 215 and the channel layer 214 may be integrally formed through a mask process without any additional processes.

In order to prevent the switch signal or the display signal from decaying due to the influences of the circuit delay, the capacitance coupling effect, or the load during transmission, as shown in FIG. 2A, the area of the patterned semiconductor layer 215 in the pixel structure 200 of the present invention is gradually increased in the transmission direction of the switch signal, so that the pixel structures 200 at different positions may have a consistent feedthrough voltage.

In detail, the magnitude of the feedthrough voltage is associated with the capacitance of the storage capacitor Cst. The feedthrough voltage may be calculated through the following formula.

$$\Delta Vp = \frac{Cgd}{Cs + Clc + Cgd} \times \Delta Vg$$

Figure 1C:
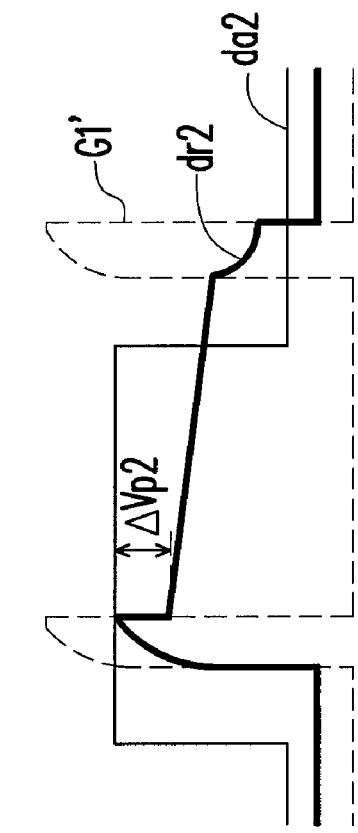
FIG. 1C is a schematic view of a pixel voltage decay of a remote pixel structure Pi in FIG. 1A.
Figure 1B:
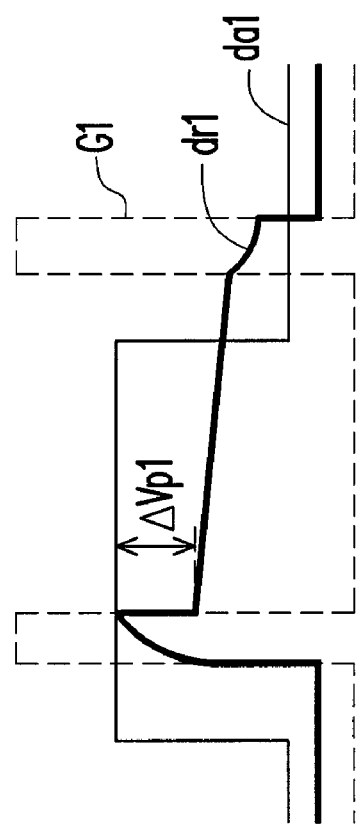
FIG. 1B is a schematic view of a pixel voltage decay of a pixel structure P1 in FIG. 1A.

$\Delta Vp$ is a voltage value of the feedthrough voltage, and $\Delta Vg$ is a voltage difference (Vgh−Vgl) between a high voltage and a low voltage of the switch signal. Cgd, Clc, and Cs are sequentially a gate-drain parasitic capacitance, a liquid crystal capacitance, and a capacitance of a storage capacitor Cst. Generally speaking, the intensity of the switch signal will be decayed along with the increase of the transmission distance, the farther the pixel structure Pi (as shown in FIG. 1 depicting the conventional art) is, the lower the feedthrough voltage $\Delta Vp$ is. The area of the patterned semiconductor layer 215 of the present invention is gradually increased in the transmission direction of the switch signal, so that the capacitance Cs of the farther storage capacitor Cs is smaller, thereby improving the feedthrough voltage $\Delta Vp$. In this manner, the pixel structures 200 at different positions may have a consistent feedthrough voltage $\Delta Vp$ by adjusting the area of the patterned semiconductor layer 215. Definitely, the area of the patterned semiconductor layer 215 in the pixel structure 200 may also be gradually increased along the transmission direction of the display signal.

Herein, the storage capacitor Cst of the present invention may be a metal/insulator/ITO (MII) structure, or a metal/insulator/metal (MIM) structure. FIG. 2C is a schematic view of another storage capacitor according to the present invention. Referring to FIG. 2C, the storage capacitor Cst' of the present invention may further include a metal layer 217. The metal layer 217 is disposed on the patterned semiconductor layer 215 and electrically connected to the pixel electrode 240. The metal layer 217 may be integrally formed with the source S, the drain D, and the data line 203 through the same mask process without any additional processes.

In view of the above, the capacitance of the storage capacitor of the present invention may be adjusted through changing a size of area of the patterned semiconductor layer. Therefore, in the present invention, the pixel structures at the different positions of the active device array substrate may have the consistent feedthrough voltage. As such, the active device array substrate of the present invention may efficiently prevent a display frame flicker phenomenon, thereby improving the display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, disposed on a substrate and adapted to be electrically connected to a scan line and a data line, the pixel structure comprising:

an active device, disposed on the substrate and comprising an insulation layer extending to the substrate;

a common line pattern, disposed on the substrate and covered with the insulation layer;

a protective layer, covering the active device and a part of the insulation layer, and comprising a contact window exposing the active device;

a pixel electrode, disposed on the protective layer, and electrically connected to the active device through the contact window; and a patterned semiconductor layer, disposed on the insulation layer above the common line pattern, and disposed between the common line pattern and the pixel electrode, so as to form a storage capacitor located outside the scan line and without physically contacting the scan line.

2. The pixel structure according to claim 1, wherein the storage capacitor comprises a capacitance changing along with a size of area of the patterned semiconductor layer.

3. The pixel structure according to claim 1, wherein the common line pattern has an H shape.

4. The pixel structure according to claim 1, wherein the storage capacitor further comprises a metal layer disposed on the patterned semiconductor layer and electrically connected to the pixel electrode, and the metal layer and the data line are in a same film layer.

5. The pixel structure according to claim 1, wherein the active device comprises:

a gate, disposed on the substrate and covered with the insulation layer, wherein the gate is electrically connected to the scan line;

a channel layer, disposed on the insulation layer above the gate;

a source/drain, respectively disposed on the channel layer, wherein the drain is electrically connected to the pixel electrode, and the source is electrically connected to the data line; and an ohmic contact layer, disposed between the source and the channel layer and between the drain and the channel layer.

6. An active device array substrate, comprising:

a substrate; and a plurality of pixel structures, disposed on the substrate, wherein each of the pixel structures is electrically connected to a corresponding scan line and a corresponding data line, and each of the pixel structures comprises:

an active device, disposed on the substrate, and comprising an insulation layer extending out of the active device and covering the substrate;

a common line pattern, disposed on the substrate and covered with the insulation layer;

a protective layer, covering the active device and a part of the insulation layer, and comprising a contact window exposing the active device;

a pixel electrode, disposed on the protective layer, and electrically connected to the active device through the contact window; and a patterned semiconductor layer, disposed on the insulation layer above the common line pattern, and disposed between the common line pattern and the pixel electrode, so as to form a storage capacitor located outside the scan line and without physically contacting the scan line.

7. The active device array substrate according to claim 6, wherein the storage capacitor comprises a capacitance changing along with a size of area of the patterned semiconductor layer.

8. The active device array substrate according to claim 6, wherein each of the data lines transmits a display signal to the corresponding pixel structures, and the area of the patterned semiconductor layer in the pixel structures is gradually increased in the transmission direction of the display signal.

9. The active device array substrate according to claim 6, wherein each of the scan lines transmits a switch signal to the corresponding pixel structures, and the area of the patterned semiconductor layer in the pixel structures is gradually increased in the transmission direction of the switch signal.

10. The active device array substrate according to claim 6, wherein the common line pattern has an H shape.

11. The active device array substrate according to claim 6, wherein the storage capacitor further comprises a metal layer disposed on the patterned semiconductor layer and electrically connected to the pixel electrode, and the metal layer and the data line are in a same film layer.

12. The active device array substrate according to claim 6, wherein the active device comprises:

a gate, disposed on the substrate and covered with the insulation layer, wherein the gate and the scan line are electrically connected;

a channel layer, disposed on the insulation layer above the gate;

a source/drain, respectively disposed on the channel layer, wherein the drain and the pixel electrode are electrically connected and the source and the data line are electrically connected; and an ohmic contact layer, disposed between the source and the channel layer and between the drain and the channel layer.

* * * * *